US011320491B2

United States Patent
Gelso

(10) Patent No.: US 11,320,491 B2
(45) Date of Patent: May 3, 2022

(54) BATTERY CELL STATE OF CHARGE ESTIMATION METHOD AND A BATTERY STATE MONITORING SYSTEM

(71) Applicant: VOLVO TRUCK CORPORATION, Gothenburg (SE)

(72) Inventor: Esteban Gelso, Gothenburg (SE)

(73) Assignee: VOLVO TRUCK CORPORATION, Gothenburg (SE)

( * ) Notice: Subject to any disclaimer, the term of this patent is extended or adjusted under 35 U.S.C. 154(b) by 190 days.

(21) Appl. No.: 16/486,997

(22) PCT Filed: Mar. 6, 2017

(86) PCT No.: PCT/EP2017/055126
§ 371 (c)(1),
(2) Date: Aug. 19, 2019

(87) PCT Pub. No.: WO2018/162021
PCT Pub. Date: Sep. 13, 2018

(65) Prior Publication Data
US 2020/0018797 A1 Jan. 16, 2020

(51) Int. Cl.
*G01R 31/387* (2019.01)
*G01R 31/367* (2019.01)
*B60L 58/12* (2019.01)

(52) U.S. Cl.
CPC .......... *G01R 31/387* (2019.01); *B60L 58/12* (2019.02); *G01R 31/367* (2019.01)

(58) Field of Classification Search
CPC ..... G01R 31/387; G01R 31/367; B60L 58/12; Y02T 10/70
(Continued)

(56) References Cited

U.S. PATENT DOCUMENTS 7,109,685 B2 * 9/2006 Tate, Jr. .............. H01M 10/48
320/132
9,329,240 B2 * 5/2016 Baba .................. H01M 10/48
(Continued)

FOREIGN PATENT DOCUMENTS

| CN | 103620432 A |   | 3/2014 |           |
|----|-------------|---|--------|-----------|
| CN | 104859471 B | * | 11/2018 | ......... B60L 50/61 |
| JP | 2013121242 A | * | 6/2013 | ......... Y02E 60/12 |

OTHER PUBLICATIONS

Xie Guang, Research on SOC estimation of lithium iron phosphate battery based on unscented Kalman filter, Chinese Master's Thesis Full-text Database, Engineering Science and Technology II Issue 7, Jul. 15, 2015, Lines 15-22 on p. 11, 7 pages.
(Continued)

*Primary Examiner* — M Baye Diao
(74) *Attorney, Agent, or Firm* — Venable LLP; Jeffri A. Kaminski

(57) ABSTRACT

The invention relates to a method for robust estimation of state of charge (SOC) for a battery cell (6) for an electric vehicle, the method comprising: measuring an output current ($I_m$) from the battery cell; a temperature ($T_m$) of the battery cell; and an output voltage (y) from the battery cell; providing a SOC estimation model (M) for the battery cell comprising the measured current ($I_m$) and the measured temperature ($T_m$) to provide an estimated output voltage ($\tilde{y}$); calculating the estimated output voltage ($\tilde{y}$) and an intermediate SOC value (SOCint) using the SOC estimation model (M); calculating a voltage difference between the estimated output voltage ($\tilde{y}$) and the measured voltage (y); estimating the SOC (SOC) for a battery cell by optimizing said SOC estimation model (M) based on the calculated voltage difference and the intermediate SOC value (SOCint). The method is characterized in that the SOC estimation model (M) further comprises a current fault estimate ($I_f$) for an
(Continued)

error of the measured current ($I_m$); and/or the SOC estimation model (M) further comprises a voltage fault estimate (yf) for an error of a measured output voltage (ym); and in that the step of estimating the SOC (SOC) for a battery cell is further optimized based on the current fault estimate (If) and/or the voltage fault estimate {yf}. The invention further relates to a computer program comprising program code performing the steps of the method, a computer readable medium carrying such a computer program, a control unit (2) for controlling the monitoring the state of a battery cell, a battery state monitoring system, and an electrical vehicle comprising such a battery state monitoring system.

11 Claims, 3 Drawing Sheets

(58) Field of Classification Search
USPC .......................................................... 324/426
See application file for complete search history.

(56) References Cited

U.S. PATENT DOCUMENTS

| | | | |
|---|---|---|---|
| 10,074,996 B2 * | 9/2018 | Stefanopoulou | H01M 10/48 |
| 2008/0094035 A1 * | 4/2008 | Plett | G01R 31/3648 |
| | | | 320/136 |
| 2012/0283970 A1 | 11/2012 | Boehm | |
| 2013/0275067 A1 * | 10/2013 | Mikuteit | G01R 31/3648 |
| | | | 702/63 |
| 2014/0074416 A1 | 3/2014 | Park et al. | |
| 2014/0232411 A1 * | 8/2014 | Vaidya | G01R 31/392 |
| | | | 324/426 |
| 2014/0244193 A1 | 8/2014 | Balasingam et al. | |
| 2016/0039419 A1 * | 2/2016 | Wampler | B60W 40/12 |
| | | | 701/22 |
| 2016/0139210 A1 | 5/2016 | Coenen | |
| 2016/0349329 A1 | 12/2016 | Wada et al. | |
| 2018/0111599 A1 * | 4/2018 | Wang | B60W 10/06 |

OTHER PUBLICATIONS

Liu Yan, Research on the SOC parameter estimation of Li-Ion battery, Chinese Master's Thesis Full-text Database, Engineering Science and Technology II Issue 5, May 15, 2016, Line 18 on p. 21-line 2 on p. 22, 8 pages.
China Office Action dated Feb. 20, 2021 in corresponding China Patent Application No. 201780088001.8, 22 pages.
International Search Report and Written Opinion dated Nov. 16, 2017 in International Application No. PCT/EP2017/055126.
China Office Action dated Jul. 29, 2021 in corresponding China Patent Application No. 201780088001.8, 19 pages.

* cited by examiner

BATTERY CELL STATE OF CHARGE ESTIMATION METHOD AND A BATTERY STATE MONITORING SYSTEM

TECHNICAL FIELD

The invention relates to a method for robust estimation of state of charge (SOC) for a battery cell. The invention further relates to a computer program comprising program code performing the steps of the method, a computer readable medium carrying such a computer program, a control unit (2) for controlling the monitoring the state of a battery cell, a battery state monitoring system, and an electrical vehicle comprising such a battery state monitoring system. The electrical vehicle may be heavy-duty vehicles, such as trucks, buses and construction equipment, but may also be used in other vehicles such as smaller electrical industrial vehicles, and passenger cars.

BACKGROUND

Electrochemical storage devices as batteries are important in modern energy infrastructure. Many different types of equipment rely on battery energy storage. In the transportation industry batteries have always been used for service purposes in vehicles with combustion engines, but as the industry develops electrical propulsion systems, the requirements of energy storage in batteries increase. Charging of batteries for electrical vehicles have to be quick, safe and reliable. Batteries are larger, has to deliver more power and are used in a more demanding way with more frequent and deeper discharges. In advanced systems as electrical vehicles accurate estimation of the state of charge of a (SOC) battery is important. State of charge (SOC) is an important variable to prevent batteries from under- or overcharging situations, and to manage the energy in electric vehicles. SOC needs to be estimated since no direct measurement is available SOC can be difficult to estimate correctly using systems and methods of the prior art.

A well-known method for estimating SOC is based on a Kalman filter, which uses a battery cell model. In this model, the cell terminal voltage is the output and the cell current and cell temperature are the inputs. Based on the errors between the output of the model and the value measured, the SOC estimated by the model is corrected. A method based on the Kalman filter introducing possible improvements of SOC estimation is presented in US 2014/0244193 A1 introducing an iterative method using a filter for improving the precision of SOC estimation. The presented method, however, only addresses problems with precision but does not address accuracy problems in the SOC estimation. There is thus a need for improved methods, systems and devices for estimation of the SOC of a battery.

SUMMARY

An object of the invention is to improve the current state of the art, to solve the above problems, and to provide an improved method for robust estimation of state of charge (SOC) for a battery cell, e.g. for an electric vehicle. These and other objects are according to a first aspect of the invention achieved by a method for robust estimation of state of charge for a battery cell for an electric vehicle. The method comprises measuring an output current from the battery cell; a temperature of the battery cell; and an output voltage from the battery cell; providing a SOC estimation model for the battery cell comprising the measured current and the measured temperature to provide an estimated output voltage; calculating the estimated output voltage and an initial SOC value using the SOC estimation model; calculating a voltage difference between the estimated output voltage and the measured voltage; and estimating the SOC for a battery cell by optimizing said SOC estimation model based on the calculated voltage difference and the initial SOC value. The method is characterized in that the SOC estimation model further comprises a current fault estimate for an error of the measured current; and/or the SOC estimation model further comprises a voltage fault estimate for an error of a measured output voltage; and in that the step of estimating the SOC for a battery cell is further optimized based on the current fault estimate and/or the voltage fault estimate. The error of the measured current may be based on errors such as bias or drift in the current sensor and the error of the measured voltage may be based on errors such as bias or drift in the voltage sensor or intermittent sensor faults.

Problems of the prior art are thereby solved in that the presented method will increase the accuracy of the SOC estimation as it takes off-set measurements errors as bias or drift in measured current or voltage from the battery into account. The accuracy of prior art Kalman filter based SOC estimator models is degraded by faults in the sensors used like the cell terminal voltage sensor or cell current sensor. The method of the present invention solves these problems and estimates a SOC that is robust to faults in voltage and current sensors. The inventive method minimizes the accuracy degradation by those faults.

The SOC estimation model may further be based on a Kalman filter model and the step of optimizing the SOC estimation may be the measurement update step of the Kalman filter model (the "correct"-step). Basing the method on a Kalman filter will further to the increased accuracy also introduce handling of noise in the SOC estimation that is affecting the precision of the results.

According to a further aspect of the invention the objects are achieved by a computer program comprising program code means for performing the steps of the method described herein, when the computer program is run on a computer.

According to a further aspect of the invention the objects are achieved by a computer readable medium carrying the aforementioned computer program comprising program code means for performing the method, when the program product is run on a computer.

According to a further aspect of the invention the objects are achieved by a control unit for controlling the monitoring of the state of a battery cell, the control unit comprising a circuit configured to perform a robust estimation of state of charge for a battery cell, wherein the control unit is arranged to perform the steps of the herein discussed method.

According to a further aspect of the invention the objects are achieved by a battery state monitoring system for monitoring the state of a battery cell; comprising a temperature sensor arranged to sense the temperature of said battery cell, or a temperature sensor located in the vicinity of the battery cell used to estimate the battery cell temperature; a current sensor arranged to measure the output current from said battery cell; a voltage sensor arranged to measure the output current from said battery cell; and a control unit as described above. According to a still further aspect of the invention the objects are achieved by an electrical vehicle comprising such a battery state monitoring system.

Further advantages and advantageous features of the invention are disclosed in the following description and in the dependent claims.

BRIEF DESCRIPTION OF THE DRAWINGS

With reference to the appended drawings, below follows a more detailed description of embodiments of the invention cited as examples.

In the drawings.

DETAILED DESCRIPTION OF EXAMPLE EMBODIMENTS OF THE INVENTION

Figure 1:
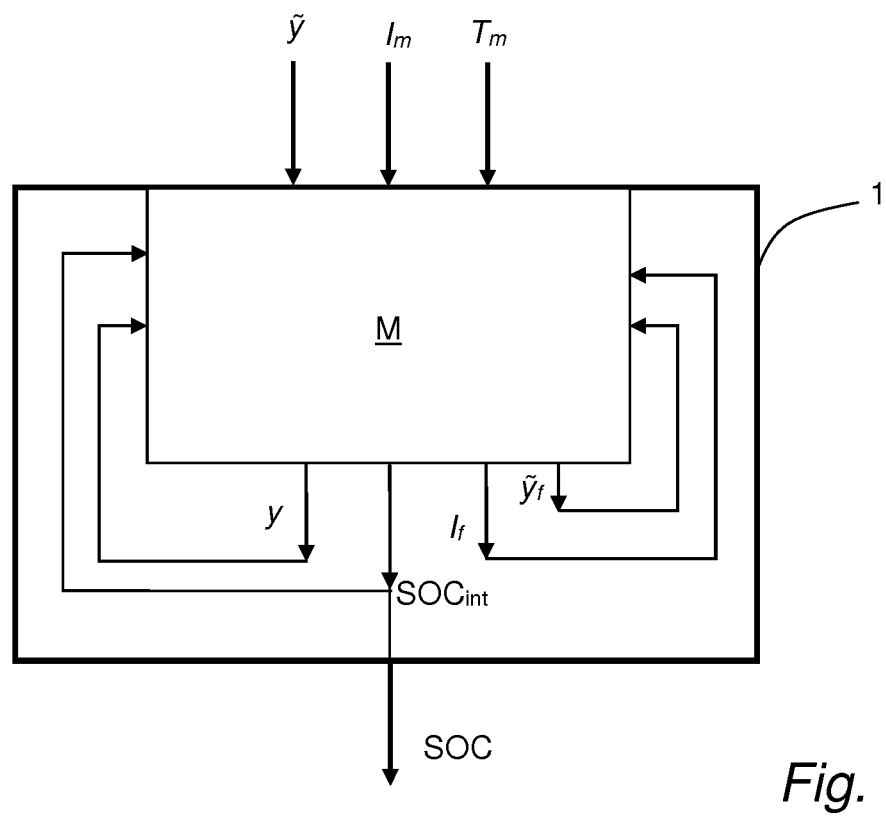
FIG. 1 is a schematic view of a circuit performing the inventive method for estimating the SOC for a battery cell from measured values of the battery output current ($I_m$), temperature ($T_m$), and output voltage ($\tilde{y}$).

FIG. 1 is a schematic view of a circuit 1 performing the inventive method M for estimating the SOC for a battery cell from measured values of the battery output current $I_m$, temperature $T_m$, and output voltage $\tilde{y}$. An intermediate SOC value ($SOC_{int}$), a calculated output voltage, a current fault estimate $I_f$ and a voltage fault estimate $\tilde{y}_f$ are iterated in the model to optimize the value of an estimated SOC value (SOC).

Figure 2:
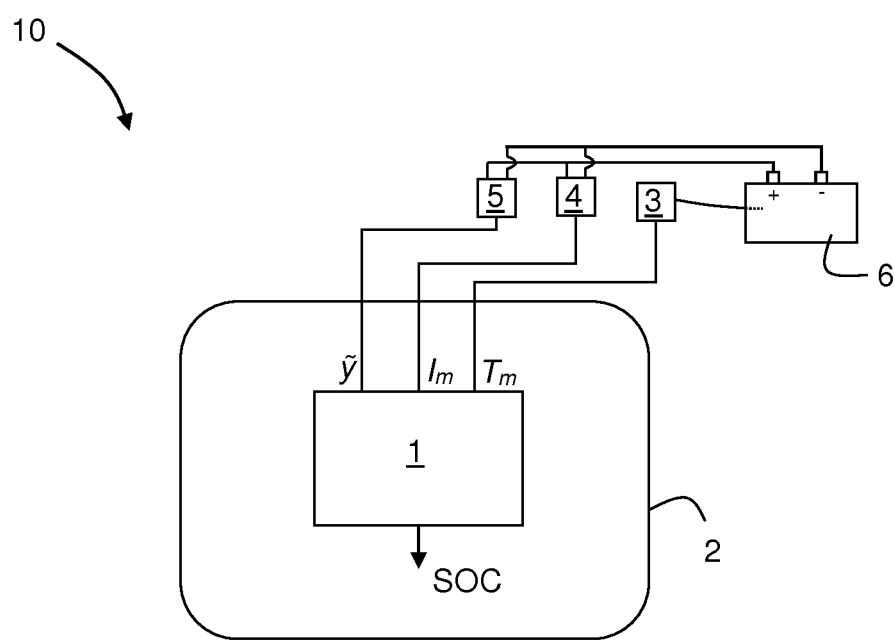
FIG. 2 is a schematic view of a battery state monitoring system for monitoring the state of a battery cell comprising the circuit of FIG. 1 in a control unit, sensors for measuring battery properties.

FIG. 2 is a schematic view of a battery state monitoring system 10 for monitoring the state 25 of a battery cell 6 comprising a control unit containing the circuit 1 of FIG. 1. A voltage sensor 5 measures the output voltage of the battery cell 6, a current sensor 4 measures the current of the battery cell 6 and a temperature sensor 3 measures the temperature of the battery 6 cell.

Figure 3:
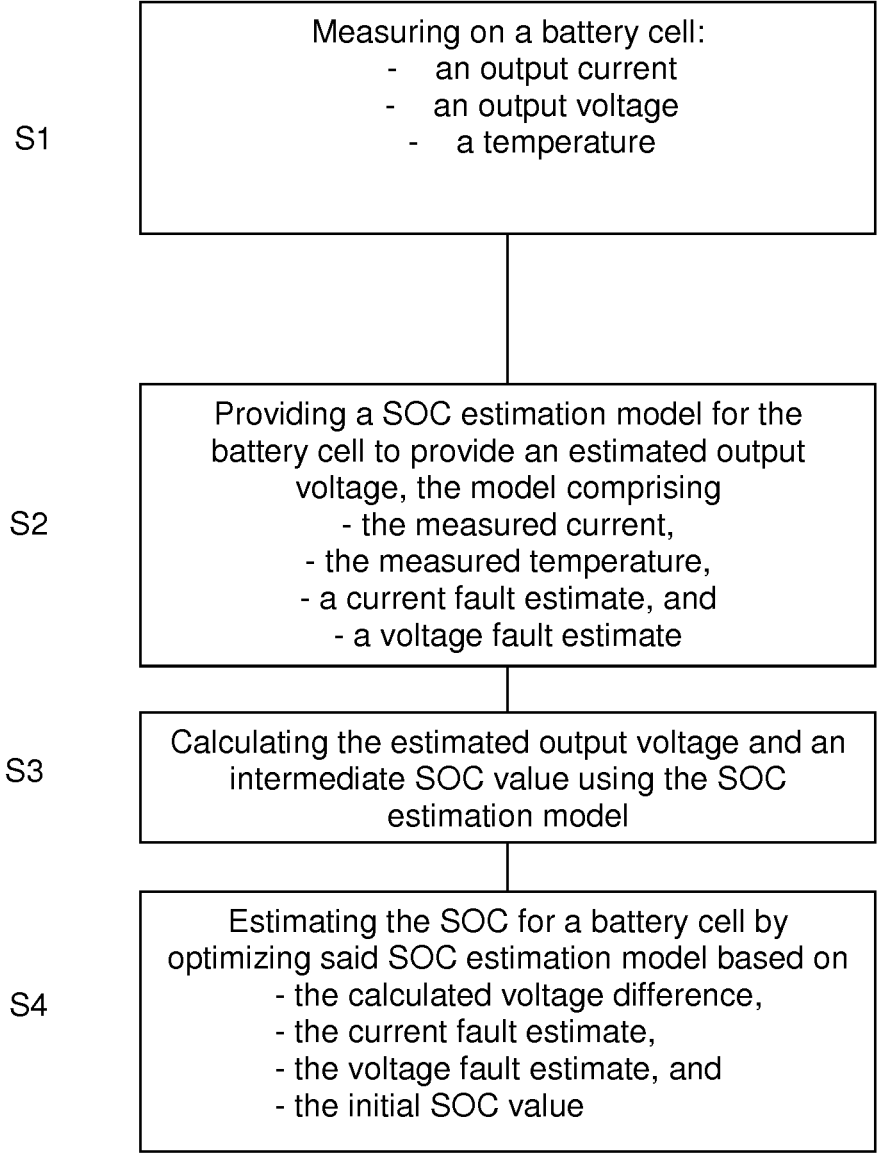
FIG. 3 is block diagram showing the inventive method for estimating the SOC for a battery cell.

With reference to FIG. 3 the main steps of the inventive method for estimating the SOC for a battery cell will be explained. In a first step S1 the method is measuring an output current $I_m$ from the battery cell, a temperature $T_m$ of the battery cell, and an output voltage $\tilde{y}$ from the battery cell. In a second step S2 a SOC estimation model M is provided for the battery cell to provide an estimated output voltage y, the model comprising the measured 35 current $I_m$ and the measured temperature $T_m$, a current fault estimate ($I_f$) and a voltage fault estimate ($\tilde{y}_f$). In a third step S3 the method is calculating the estimated output voltage and an intermediate SOC value $SOC_{int}$ using the SOC estimation model M. In a fourth step S4 the method is Estimating the SOC for a battery cell by optimizing said SOC estimation model based on the calculated voltage difference, the current fault estimate, the voltage fault estimate, and the initial SOC value.

Figure 4:
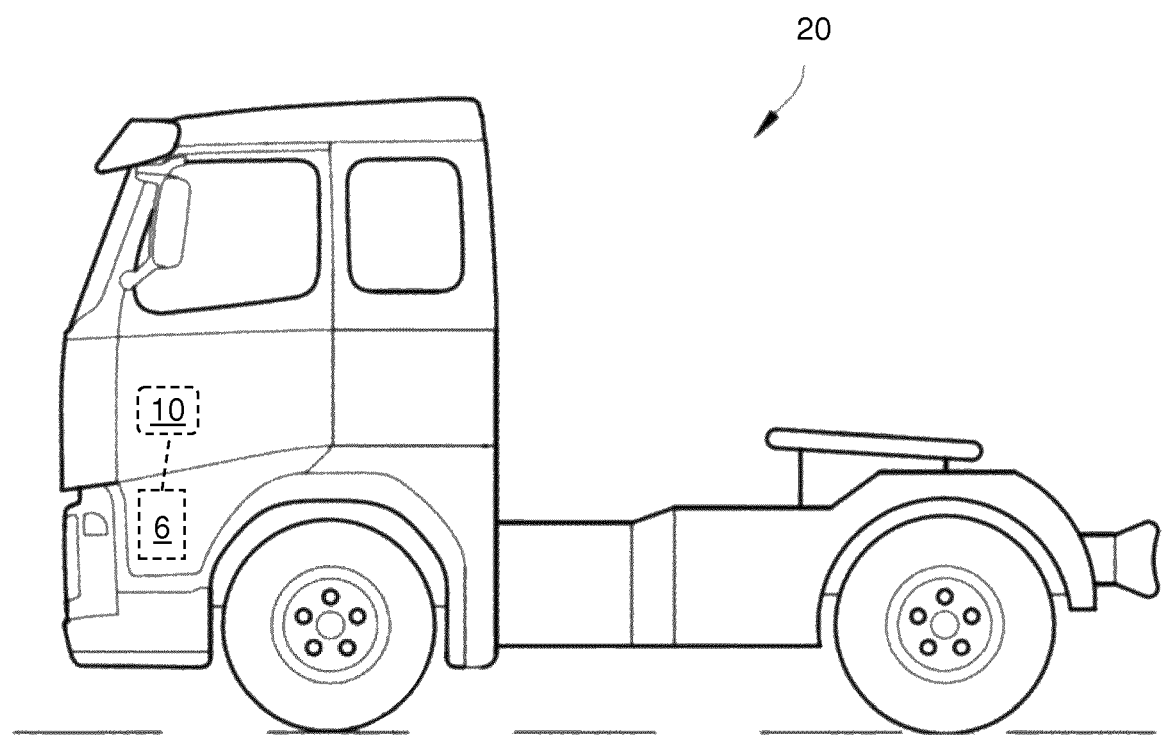
FIG. 4 is schematic view of an electrical vehicle comprising the battery state monitoring system of FIG. 3.

FIG. 4 is schematic view of an electrical vehicle 20 comprising the battery state monitoring system 10 shown in FIG. 3 connected to a battery cell 6 of the electrical vehicle.

The inventive method will now be discussed more in detail with exemplifying mathematic expressions for carrying out the method.

The SOC estimator is designed to be robust to faults or errors in voltage and current sensors. According to the invention, the model M is extended by an additional state ($x_4$) to consider faults like a bias or a drift in the current sensor; and an additional variable z(k) is added to model faults in the cell terminal voltage sensor. For the faults in the cell terminal voltage sensors, an optimization problem is solved online. In the description below $x_3$ is the estimated SOC, $x_4$ is the current fault estimate $I_f$, and z(k) is the voltage fault estimate $\tilde{y}_f$.

When considering a fault, e.g. a bias or drift, in the measurement of the current I, in the proposed method an additional state $x_4$ is added to the battery cell model used in the SOC estimator. See for example the case of a 2RC circuit model with the additional state $x_4$, and an additional equation (fourth equation):

$$x_1(k+1) = x_1(k)\left(1 - \frac{1}{C_1 R_1}\right) - \frac{1}{C_1}(I(k) + x_4(k)) + w_1(k)$$

$$x_2(k+1) = x_2(k)\left(1 - \frac{1}{C_2 R_2}\right) - \frac{1}{C_2}(I(k) + x_4(k)) + w_2(k)$$

$$x_3(k+1) = x_3(k) - \frac{\eta \cdot T_s}{C_n}(I(k) + x_4(k)) + w_3(k)$$

$$x_4(k+1) = x_4(k) + w_4(k)$$

where $C_1$ and $C_2$ are capacitances, and $R_1$ and $R_2$ are resistances, of the RC branches of the equivalent circuit model of the battery cell. $\eta$ is the Coulombic efficiency of the battery cell, $T_s$ is the sampling time, and $C_n$ is the battery cell capacity. w is the process noise.

In the previous model, $x_3$ is the SOC, and $x_1$ and $x_2$ are the voltages in the RC branches.

In a more compact expression, it can be written as:

$$x(k+1) = A \cdot x(k) + B \cdot I(k) + w(k)$$

where $x(k) = [x_1(k) x_2(k) x_3(k) x_4(k)]^T$.

The output voltage is defined as:

$$y(k) = OCV(x_3(k)) - R_0(I(k) + x_4(k)) + x_1(k) + x_2(k) + v(k)$$

where $R_0$ is the ohmic resistance, and OCV is the open circuit voltage, which in this case is a function of the SOC. v is the observation noise. It can also be written in a more compact way as:

$$y(k) = g(x(k), I(k)) + v(k)$$

Note that the following parameters of the model: $C_1$, $C_2$, $R_1$, $R_2$, $\eta$, and $C_n$ can be time variant, that is they can change the value with time and, for example, with the battery cell temperature. The parameters can also change with the current SOC value, and the battery cell output current.

The SOC estimator, which could be for example a Kalman filter, is used with the described 2RC circuit model.

Faults in the cell terminal voltage sensor of the SOC estimator degrades the accuracy of the SOC estimator. Examples of faults include a bias, a drift, or a random spike (outlier). In the inventive method, they are modeled as a variable z(k), which is now included in the battery cell terminal voltage y(k) as:

$$y(k) = g(x(k) \cdot I(k)) + v(k) + z(k)$$

z(k) is minimized in an optimization problem solved every time instant, such that the error between the voltage measurement and the battery cell model prediction is minimized.

The optimization problem is solved in the Measurement Update or "Correct" step of the Kalman filter.

The following optimization problem is solved:

$$\min_{\hat{x}(k),z(k)} c_1 \cdot \frac{(\tilde{y}(k) - \hat{y}(k))^2}{R(k)} + c_2 \cdot (\hat{x}(k) - \hat{x}^-(k)) \cdot P^-(k) \cdot (\hat{x}(k) - \hat{x}^-(k)) + \sigma \cdot |z(k)|$$

$$\text{s.t. } \hat{y}(k) = \hat{y}^-(k) + G(k) \cdot (\hat{x}(k) - \hat{x}^-(k))$$

where $\tilde{y}(k)$ is the measured cell terminal voltage at time k, $\hat{y}(k)$ is the estimated cell terminal voltage, and $P^-$ is the prior state covariance.

$c_1$, $c_2$, and $\sigma$ are tuning parameters greater than 0, and G is equal to:

$$G(k) = \frac{\partial g}{\partial x(k)}\bigg|_{\hat{x}^-(k)}$$

In the 2RC battery cell model, G is equal to:

$$G(k) = \lfloor 1, 1, dOCV|_{\hat{x}_3^-(k)}, -R_0 \rfloor$$

$\hat{x}^-(k)$ and $P^-(k)$ are the outcomes of the first step of the Kalman filter (the "Predict" step, also called Time Update), and $x_3^-$ is the intermediate SOC value $SOC_{int}$.

It is to be understood that the present invention is not limited to the embodiments described above and illustrated in the drawings; rather, the skilled person will recognize that many changes and modifications may be made within the scope of the appended claims.

The invention claimed is:

1. A method for robust estimation of state of charge (SOC) for a battery cell (6), the method comprising:
   measuring an output current ($I_m$) from the battery cell; a temperature ($T_m$) of the battery cell; and an output voltage ($\tilde{y}$) from the battery cell;
   providing a SOC estimation model (M) for the battery cell comprising the measured current ($I_m$) and the measured temperature ($T_m$) to provide an estimated output voltage (y);
   calculating the estimated output voltage (y) and an intermediate SOC value ($SOC_{int}$) using the SOC estimation model (M);
   calculating a voltage difference between the estimated output voltage (y) and the measured output voltage ($\tilde{y}$);
   estimating the SOC (SOC) for a battery cell by optimizing said SOC estimation model (M) based on the calculated voltage difference and the intermediate SOC value ($SOC_{int}$); characterized in that
   the SOC estimation model (M) further comprises a current fault estimate ($I_f$) for an error of the measured current ($I_m$); and
   the SOC estimation model (M) further comprises a voltage fault estimate ($\tilde{y}_f$) for an error of the measured output voltage ($\tilde{y}$); and in that the step of estimating the SOC (SOC) for a battery cell is further optimized based on the current fault estimate ($I_f$) and the voltage fault estimate ($\tilde{y}_f$).

2. The method according to claim 1, wherein the error of the measured current ($I_m$) is based on errors such as bias or drift in the current sensor (4).

3. The method according to claim 1, wherein the error of the measured voltage ($\tilde{y}_m$) is based on errors such as bias, drift, or intermittent fault in the voltage sensor (5).

4. The method according to claim 3, wherein the SOC estimation model is based on a Kalman filter model and the step of optimizing the SOC estimation is the measurement update step of the Kalman filter model.

5. The method according to claim 4, wherein the SOC estimation model is based on a 2RC circuit model and wherein
the states of the 2RC circuit model are defined as $$x_1(k+1) = x_1(k)\left(1 - \frac{1}{C_1 R_1}\right) - \frac{1}{C_1}(I(k) + x_4(k)) + w_1(k)$$

$$x_2(k+1) = x_2(k)\left(1 - \frac{1}{C_2 R_2}\right) - \frac{1}{C_2}(I(k) + x_4(k)) + w_2(k)$$

$$x_3(k+1) = x_3(k) - \frac{\eta \cdot T_s}{C_n}(I(k) + x_4(k)) + w_3(k)$$

$$x_4(k+1) = x_4(k) + w_4(k)$$

wherein $x_3$ is the SOC, $x_1$ and $x_2$ are the voltages in the RC branches, $x_4$ is the current fault estimate, and k is a time step unit; and
the output voltage is defined as $$y(k) = OCV(x_3(k)) - R_0(I(k) + x_4(k)) + x_1(k) + x_2(k) + v(k)$$

(OCV=Open-Circuit Voltage).

6. The method according to claim 5, the SOC estimation model further comprising the voltage fault estimate z(k), such that the output voltage is defined as:

$$y(k) = OCV(x_3(k)) - R_0(I(k) + x_4(k)) + x_1(k) + x_2(k) + v(k) + z(k).$$

7. The method according to claim 6, wherein step of estimating the SOC for a battery cell is performed by solving the optimization problem:

$$\min_{\hat{x}(k),z(k)} c_1 \cdot \frac{(\tilde{y}(k) - \hat{y}(k))^2}{R(k)} + c_2 \cdot (\hat{x}(k) - \hat{x}^-(k)) \cdot P^-(k) \cdot (\hat{x}(k) - \hat{x}^-(k)) + \sigma \cdot |z(k)|$$

$$\text{s.t. } \hat{y}(k) = \hat{y}^-(k) + G(k) \cdot (\hat{x}(k) - \hat{x}^-(k))$$

where $\tilde{y}(k)$ is the measured cell terminal voltage at time k, and $\hat{y}(k)$ is the estimated cell terminal voltage $c_1$, $c_2$, and $\sigma$ are tuning parameters greater than 0, and G is equal to:

$$G(k) = \frac{\partial g}{\partial x(k)}\bigg|_{\hat{x}^-(k)}$$

and in the 2RC battery cell model, G is equal to:

$$G(k) = \lfloor 1, 1, dOCV|_{\hat{x}_3^-(k)}, -R_0 \rfloor$$

$\hat{x}^-(k)$ and $P^-(k)$ are the outcomes of the first step of the Kalman filter.

8. A non-transitory computer readable medium carrying a computer program comprising program code for performing the steps of claim 1, when said program code is run on a computer.

9. A control unit (2) for controlling the monitoring of the state of a battery cell (6), the control unit comprising a circuit (1) configured to perform a robust estimation of state of charge (SOC) for a battery cell (6), wherein the control unit (2) is arranged to perform the steps of the method according to claim 1.

10. A battery state monitoring system for monitoring the state of a battery cell (6); comprising
- a temperature sensor (3) arranged to sense the temperature of said battery cell (6);
- a current sensor (4) arranged to measure the output current ($I_m$) from said battery cell (6);
- a voltage sensor (5) arranged to measure the output voltage $\tilde{y}$ from said battery cell (6); and
- a control unit (2) according to claim 9.

11. An electrical vehicle comprising the battery state monitoring system according to claim 10.

* * * * *